(12) United States Patent
Mizuno et al.

(10) Patent No.: US 7,936,065 B2
(45) Date of Patent: May 3, 2011

(54) SEMICONDUCTOR DEVICES AND METHOD OF MANUFACTURING THEM

(75) Inventors: Yoshihito Mizuno, Nagoya (JP); Masahiro Kinokuni, Nisshin (JP); Shinji Koike, Toyota (JP); Masahiro Matsumoto, Chigasaki (JP); Fumitsugu Yanagihori, Chigasaki (JP)

(73) Assignees: Toyota Jidosha Kabushiki Kaisha, Toyota-shi, Aichi-ken (JP); ULVAC, Inc., Kanagawa-ken (JP)

( * ) Notice: Subject to any disclaimer, the term of this patent is extended or adjusted under 35 U.S.C. 154(b) by 728 days.

(21) Appl. No.: 11/808,465

(22) Filed: Jun. 11, 2007

(65) Prior Publication Data

US 2007/0296080 A1    Dec. 27, 2007

(30) Foreign Application Priority Data

Jun. 12, 2006  (JP) ................... 2006-161931

(51) Int. Cl.
*H01L 23/48* (2006.01)

(52) U.S. Cl. ........ 257/750; 257/741; 257/763; 257/765; 257/766; 257/E29.114; 438/652; 438/656; 438/660; 438/685

(58) Field of Classification Search .................. 257/734, 257/E29.114, E29.201; 438/597, 652, 656, 438/660, 665, 666, 685
See application file for complete search history.

(56) References Cited

U.S. PATENT DOCUMENTS

| | | | | |
|---|---|---|---|---|
| 4,164,431 A * | 8/1979 | Tang | ................. | 136/263 |
| 5,726,499 A * | 3/1998 | Irinoda | ................. | 257/774 |
| 5,726,501 A * | 3/1998 | Matsubara | ................. | 257/778 |
| 5,828,101 A * | 10/1998 | Endo | ................. | 257/330 |
| 6,117,771 A * | 9/2000 | Murphy et al. | ................. | 438/679 |
| 6,309,965 B1 | 10/2001 | Matschitsch | | |
| 6,514,804 B1 | 2/2003 | Yamaguchi | | |
| 6,731,494 B2 * | 5/2004 | Nakamura | ................. | 361/306.1 |
| 2001/0015676 A1 * | 8/2001 | Takikawa et al. | ................. | 330/307 |
| 2004/0035909 A1 * | 2/2004 | Yeh et al. | ................. | 228/56.3 |
| 2004/0217474 A1 | 11/2004 | Kajiwara et al. | | |
| 2004/0237327 A1 | 12/2004 | Okabe et al. | | |
| 2005/0212076 A1 | 9/2005 | Schulze et al. | | |
| 2006/0049521 A1 | 3/2006 | Kayukawa et al. | | |

(Continued)

FOREIGN PATENT DOCUMENTS

JP    55-73868    6/1980

(Continued)

OTHER PUBLICATIONS

German Office Action dated Dec. 17, 2008.

(Continued)

*Primary Examiner* — Matthew C Landau
*Assistant Examiner* — Colleen E Snow
(74) *Attorney, Agent, or Firm* — Finnegan, Henderson, Farabow, Garrett & Dunner, LLP

(57) ABSTRACT

A semiconductor device is provided with a silicon substrate, with a surface for soldering the silicon substrate to a ceramic substrate, and an electrode making contact with the surface of the silicon substrate. The electrode comprises a first conductor layer, a second conductor layer, and a third conductor layer. The first conductor layer makes contact with the surface of the silicon substrate and includes aluminum and silicon. The second conductor layer makes contact with the first conductor layer and includes titanium. The third conductor layer is separated from the first conductor layer by the second conductor layer and includes nickel.

11 Claims, 7 Drawing Sheets

U.S. PATENT DOCUMENTS

| | | |
|---|---|---|
| 2006/0181828 A1* | 8/2006 | Sato et al. .................... 361/91.1 |
| 2007/0004098 A1* | 1/2007 | Kazama et al. ............... 438/141 |
| 2007/0173045 A1 | 7/2007 | Matsumura et al. |
| 2009/0206726 A1* | 8/2009 | Yamazaki et al. ............ 313/498 |

FOREIGN PATENT DOCUMENTS

| | | |
|---|---|---|
| JP | 4-72764 | 3/1992 |
| JP | 5-136080 | 6/1993 |
| JP | 8-264765 | 10/1996 |
| JP | 10-163467 | 6/1998 |
| JP | 2000-147658 | 5/2000 |
| JP | 2001-36095 | 2/2001 |
| JP | 2002-299623 | 10/2002 |
| JP | 2002-343980 | 11/2002 |
| JP | 2003-86787 | 3/2003 |

OTHER PUBLICATIONS

Japanese Office Action dated May 7, 2008.

Japanese Office Action dated Aug. 12, 2008.

* cited by examiner

FIG. 5
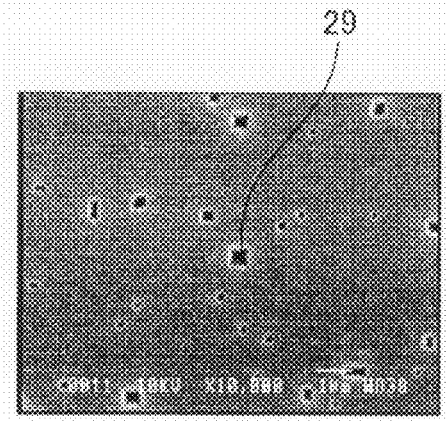
200nm
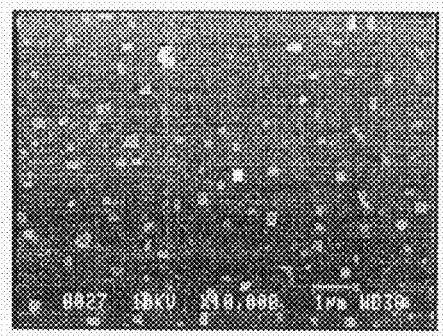
800nm
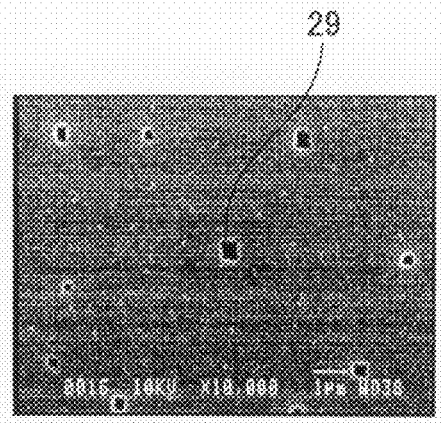
400nm
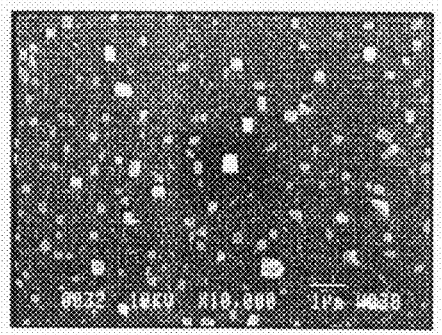
1000nm
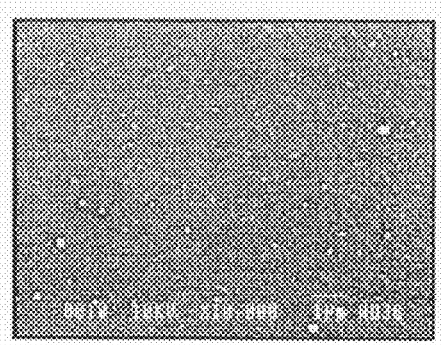
600nm
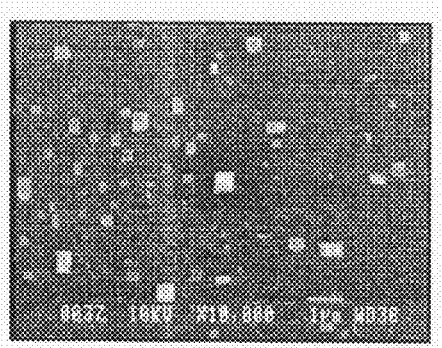
1200nm

FIG. 7
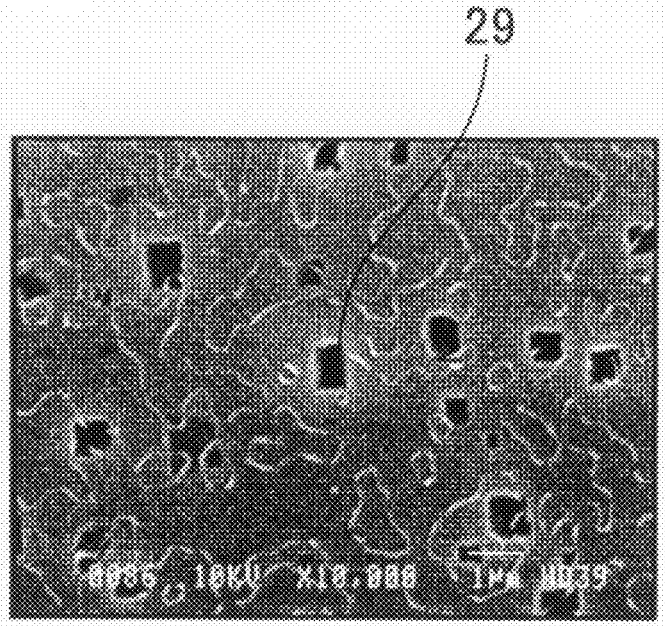
1000nm
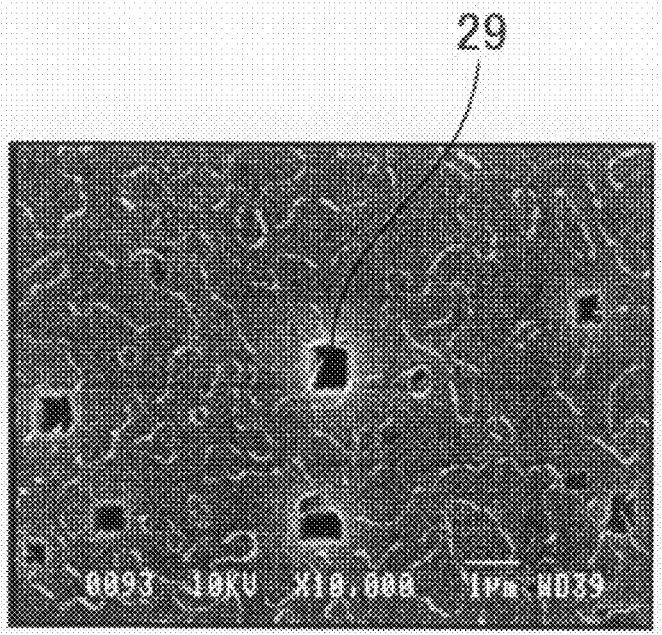
1200nm

SEMICONDUCTOR DEVICES AND METHOD OF MANUFACTURING THEM

CROSS REFERENCE TO RELATED APPLICATION

This application claims priority to Japanese Patent Application No. 2006-161931 filed on Jun. 12, 2006, the contents of which are hereby incorporated by reference into the present application.

BACKGROUND OF THE INVENTION

1. Field of the Invention

The present invention relates to a semiconductor device.

2. Description of the Related Art

In general, a semiconductor device comprises a silicon substrate which has a plurality of semiconductor regions. The semiconductor device is identified as an IGBT (Insulated Gate Bipolar Transistor), a MOSFET (Metal Oxide Semiconductor Field Effect Transistor) or a Diode in accordance with the configuration and the positional relationship of the plurality of semiconductor regions. The semiconductor device further comprises a pair of main electrodes, wherein one of the main electrodes (a surface electrode) is formed on a top surface of the silicon substrate and the other main electrode (a reverse electrode) is formed on a bottom surface of the silicon substrate. In order to solder the semiconductor device to a ceramic substrate, the reverse electrode may comprise a plurarity of conductor layers.

Japanese Laid-Open Patent Publication H10-163467 discloses a semiconductor device comprising a silicon substrate and a collector electrode (one example of a reverse electrode), wherein the collector electrode comprises a plurarity of conductor layers. The collector electrode comprises a first conductor layer, a second conductor layer, and a third conductor layer. The first conductor layer makes contact with the surface of the silicon substrate and includes aluminum. The second conductor layer makes contact with the first conductor layer and includes titanium. The third semiconductor layer is separated from the first conductor layer by the second conductor layer and includes nickel. The first conductor layer can improve the electrical contact properties between the surface of the silicon substrate and the collector electrode. The second conductor layer can improve the adhesion properties between the first conductor layer and the third conductor layer, and can also prevent the nickel in the third conductor layer from diffusing into the first conductor layer. The third conductor layer can improve the adhesion properties between the collector electrode and the solder.

When this type of semiconductor device is soldered to the ceramic substrate, the semiconductor device is exposed to heat as the solder is fused to the collector electrode. In general, the amount of the heat evolved by fusing the solder is adjusted to a temperature between 200 and 450 degrees C. such that the heat does not influence the surface structure (such as the passivation mask or the surface electrode made of aluminum) of the semiconductor device. However, even if the temperature is adjusted to between such a range, a portion of the silicon existing in the silicon substrate will diffuse into the first conductor layer. In this case, a lot of voids are formed in the surface of the silicon substrate, while aluminum in the first conductor layer penetrates into voids. As a result, a lot of aluminum spikes are formed at the boundary between the silicon substrate and the first conductor layer.

BRIEF SUMMARY OF THE INVENTION

In the technique described in the present specification, the first conductor layer is initially doped with silicon. As the first conductor layer contains silicon, the diffusion of silicon from the silicon substrate into the first conductor layer can be repressed. Therefore, the formation of aluminum spikes can be also repressed.

In order to further repress the formation of aluminum spikes, the inventors researched the type of the electrode utilized in semiconductor devices. As a result, the inventors have found a region containing a high concentration of silicon is localized around the boundary between the first conductor layer and the second conductor layer. This region, containing a high concentration of silicon, is believed to be the result of silicon in the first conductor layer binding to titanium in the second conductor layer. That is, it is believed that a proportion of the silicon in the first conductor layer is redistributed toward the second conductor layer side, the silicon then binds strongly to the titanium in the second conductor layer at the boundary between the first conductor layer and the second conductor layer. Therefore, the concentration of silicon in the first conductor layer varies across a depth of the first conductor layer so that the concentration of silicon is lower at the silicon substrate side. It is believed that the lower concentration of silicon in the first conductor layer at the silicon substrate side activates the diffusion of silicon into the first conductor layer.

The inventors also considered a native oxide layer formed on the surface of the silicon substrate. The native oxide layer is formed by necessity on the surface of the silicon substrates manufactured using the current manufacturing technique. The native oxide layer has an uneven thickness. It is thought that the aluminum spikes form as a result of the uneven thickness of the native oxide.

The inventors can provide a technique for further repressing the formation of aluminum spike in accordance with the aforementioned new technical knowledge.

In the technique described in the present specification, a semiconductor device comprises a silicon substrate with a surface for soldering the silicon substrate to a ceramic substrate, and an electrode that makes contact with the surface of the silicon substrate. The electrode comprises a first conductor layer, a second conductor layer, and a third conductor layer. The first conductor layer makes contact with the surface of the silicon substrate and includes aluminum and silicon. The second conductor layer makes contact with the first conductor layer and includes titanium. The third conductor layer is separated from the first conductor layer by the second conductor layer and includes nickel. This composition has special technical advantages which have not been identified in the past. As the first conductor layer is doped with silicon, the diffusion of silicon from the silicon substrate into the first conductor layer can be repressed. Therefore, the formation of aluminum spikes can be also repressed.

In the technique described in the present specification, further measures for improving the above semiconductor device can be provided. As a result, the technique described in the present specification can provide a semiconductor device which drastically represses the formation of aluminum spikes.

In one of the semiconductor devices to which the further measures is applied, it is preferred that a thickness of the first conductor layer is greater than or equal to 600 nm.

In a case where the thickness of the first conductor layer is greater than or equal to 600 nm, the silicon in the first conductor layer at the silicon substrate side is rarely redistributed, even if silicon in the first conductor layer, at the second conductor layer side, is redistributed towards the boundary between the first conductor layer and the second conductor layer. Therefore, the concentration of silicon in the first conductor layer at the silicon substrate side can be maintained before as well as after the heat is applied to the electrode during the soldering of the semiconductor device to the ceramic substrate. In the above semiconductor device, the formation of aluminum spikes at the surface of the silicon substrate can be repressed.

In another one of the semiconductor devices to which the further measures are applied, it is preferred that the concentration of silicon in the first conductor layer varies across a depth of the first conductor layer so that concentration of silicon decreases at a depth between the surface making contact with the silicon substrate and the surface making contact with the second conductor layer. In this case, it is preferred that the distance between the surface making contact with the silicon substrate and the depth at which concentration of silicon is at a minimum in the first conductor layer is greater than or equal to 50 nm.

The above description details a state of the electrode after the heat exposure for soldering the semiconductor device to the ceramic substrate. In general, the concentration of silicon varies across the depth of the first conductor layer after heat exposure. If the point at which the concentration of silicon is at a minimum is located above a set position in relation to the silicon substrate, it is evaluated that the diffusion of silicon from the silicon substrate into the first conductor layer has been repressed. Therefore, if the concentration of silicon in the first conductor layer is in the above state, it can be evaluated that the diffusion of silicon from the silicon substrate into the first conductor layer has been repressed. In the above semiconductor device, the formation of aluminum spikes at the surface of the silicon substrate can be repressed.

In another one of the semiconductor devices to which the further measures are applied, it is preferred that the concentration of silicon in the first conductor layer, between a surface making contact with the silicon substrate and a depth 25 nm from the surface making contact with the silicon substrate, maintains substantially the same value before and after exposure to heat as a result of soldering the semiconductor device to the ceramic substrate.

The term "maintain substantially the same value" means a rate of variability is less than or equal to 25%.

Since the concentration of the silicon in the area described above does not substantially decrease and instead maintains a concentration comparable to the concentration prior to heat exposure, the diffusion of silicon from the silicon substrate to the first conductor layer has been repressed. Therefore, in the above semiconductor device, the formation of aluminum spikes at the surface of the silicon substrate can be repressed.

In another one of the semiconductor devices to which the further measures are applied, it is preferred that the boundary between the silicon substrate and the first conductor layer is free from native oxide.

In the above semiconductor device, the surface of the silicon substrate is a flat surface since the native oxide is not present on the surface of the silicon substrate. Since the surface of the silicon substrate is a flat surface, the number of the starting points for the formation of aluminum spikes is decreased. Therefore, the formation of aluminum spikes at the surface of the silicon substrate can be repressed.

In the above semiconductor device, it is preferred that the silicon substrate comprises a collector region formed within the surface of the silicon substrate, wherein the collector region includes a p-type impurity.

The above semiconductor device is identified as IGBT. In an IGBT, if an aluminum spike forms in the collector region, the quality of the IGBT will decrease remarkably. Therefore, the technique described in the present specification is especially useful for the IGBT in order to stabilize its properties.

It is preferred that any one of the above semiconductor devices is applied to a module. The module comprises the one of the above semiconductor devices and a ceramic substrate. In this case, it is preferred that the semiconductor device is soldered to the ceramic substrate.

In the technique described in this present specification, a method of manufacturing a semiconductor device can be provided. The method is applied to a semiconductor device comprising a silicon substrate, a first conductor layer, a second conductor layer, and a third conductor layer. The method comprises a step during which a surface of the silicon substrate is etched by means of an inverse sputter technique using a sputter device. The method further comprises a step during which the first conductor layer is formed on the surface of the silicon substrate by means of a sputter technique using the sputter device, wherein the silicon substrate etching step and the first conductor layer forming step are sequentially performed under vacuum. The method further comprises a step during which the second conductor layer is formed on the first conductor layer by means of the sputter technique, and a step during which the third conductor layer is formed on the second conductor layer by means of the sputter technique. In this method, the first conductor layer includes aluminum and silicon, the second conductor layer includes titanium, and the third conductor layer includes nickel.

In the above method, the silicon substrate etching step is performed before the first conductor layer forming step is performed. When the surface of the silicon substrate is etched, the native oxide is removed from the surface of the silicon substrate, and the surface of the silicon substrate is smoothed. Since the silicon substrate etching step and the first conductor layer forming step are performed sequentially, the silicon substrate is not exposed to air. Therefore, in the first conductor layer forming step, the first conductor layer can be formed on the surface of the silicon substrate without the presence of the native oxide. In the semiconductor device manufactured using the above manufacturing method, the number of the starting points for the formation of aluminum spikes is decreased and as a result the formation of aluminum spikes at the surface of the silicon substrate can be repressed.

In the technique described in the present specification, a method of manufacturing the above module can be provided. The method comprises a step in which the semiconductor device is soldered to the ceramic substrate is such a way that the temperature is maintained at a level less than or equal to 400 degrees C. Furthermore, if necessary, it is preferred that the first conductor layer in the semiconductor device is formed such that a thickness of the first conductor layer is greater than or equal to 600 nm.

BRIEF DESCRIPTION OF THE DRAWINGS

FIG. 5 shows the state of a bottom surface of a silicon substrate following heat exposure under the following conditions: two 10 minute exposures at 375 degrees C.

FIG. 7 shows a state of a bottom surface of a silicon substrate following heat exposure under the following conditions: two 10 minute exposures at 425 degrees C.

DETAILED DESCRIPTION OF THE INVENTION

First Embodiment

Figure 1:
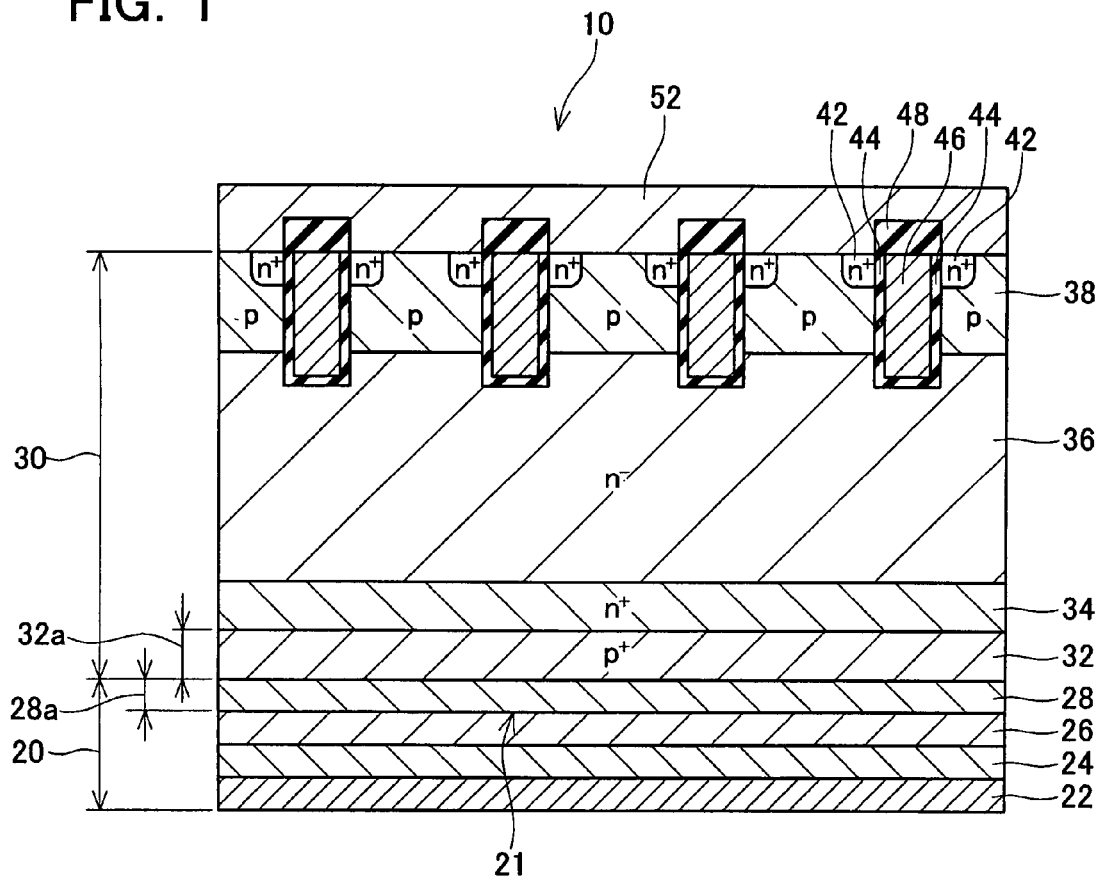
FIG. 1 shows a cross-sectional diagram of a semiconductor device of a first embodiment.

FIG. 1 shows a cross-sectional diagram of a semiconductor device 10. The semiconductor device 10 is identified as a PT (Punch Through) type IGBT. In FIG. 1, the reference numbers of repeated features are omitted to clarify the figure.

The semiconductor device 10 comprises a silicon substrate 30 and a collector electrode 20 making contact with a bottom surface of the silicon substrate 30. The collector electrode 20 comprises a first conductor layer 28, a second conductor layer 26, and a third conductor layer 24. The first conductor layer 28, the second conductor layer 26 and the third conductor layer 24 are stacked on the bottom surface of the silicon substrate 30. The first conductor layer 28 makes contact with the bottom surface of the silicon substrate 30. The second conductor layer 26 makes contact with the first conductor layer 28 and the third conductor layer 24. The third conductor layer 24 is separated from the first conductor layer 28 by the second conductor layer 26. The third conductor layer 24 is covered with a covering layer 22 made of gold (Au).

The first conductor layer 28 includes aluminum and silicon. The thickness 28a of the first conductor layer 28 across its depth is adjusted so that it is greater than or equal to 600 nm. The second conductor layer 26 includes titanium. The thickness of the second conductor layer 26 across its depth direction is adjusted so that it is approximately 200 nm. The third conductor layer 24 includes nickel. The thickness of the third conductor layer 24 along the depth direction is adjusted to so that it is approximately 700 nm. The thickness of the covering layer 22 is adjusted so that it is 100 nm.

The first conductor layer 28 can improve the electrical contact properties between the collector electrode 20 and a collector region 32 formed within the silicon substrate 30 at the bottom surface. The second conductor layer 26 can improve the adhesion properties between the first conductor layer 28 and the third conductor layer 24, and also can prevent the nickel in the third conductor layer 24 from diffusing into the first conductor layer 28. The third conductor layer 24 can improve the adhesion properties between the collector electrode 20 and the solder. The covering layer 22 can improve the solderability.

The semiconductor device 10 is configured with a plurality of semiconductor regions formed within the silicon substrate 30. A collector region 32 is formed within the silicon substrate 30 at the bottom surface. The collector region 32 includes a high concentration of p-type impurities (typically boron). The collector region 32 is formed by means of an ion-implantation technique in such a way that ions are implanted toward the bottom surface of the silicon substrate 30. It is preferred that concentration of p-type impurities of the collector region 32 and the thickness of the collector region 32 across its depth are adjusted such that the supply of positive charge from the collector region 32 is low in the on-state.

A buffer region 34 is formed on the collector region 32. The buffer region 34 includes a high concentration of n-type impurities (typically phosphorus). The buffer region 34 is formed by means of an ion-implantation technique in such a way that ions are implanted toward the bottom surface of the silicon substrate 30. The buffer region 34 prevents the depletion layer, which extends from the boundary between the body region 38 and the drift region 36, from reaching to the collector region 32.

The drift region 36 is formed on the buffer region 34. The drift region 36 includes a low concentration of n-type impurities (typically phosphate). The thickness of the drift region 36 across its depth is adjusted in accordance with the breakdown voltage requested for the semiconductor device 10.

The body region 38 is formed on the drift region 36. The body region 38 includes p-type impurities (typically phosphorus). The body region 38 is formed by means of an ion-implantation technique in such a way that ions are implanted toward the top surface of the silicon substrate 30.

A plurality of emitter regions 42 is selectively formed in the body region 38 at the top surface of the silicon substrate 30. The plurality of emitter regions 42 includes a high concentration of n-type impurities (typically phosphorus). The plurality of emitter regions 42 is formed by means of an ion-implantation technique in such a way that ions are implanted toward the top surface of the silicon substrate 30. The plurality of emitter regions 42 is separated from the drift region 36 by the body region 38.

The semiconductor device 10 further comprises a plurality of trench gate electrodes 46. Each trench gate electrode 46 extends from the top surface of the silicon substrate 30 into the drift region 36. The trench gate electrode 46 is insulated from the body region 38 and the drift region 36 by a gate insulator 44. The trench gate electrode 46 is covered by the gate insulator 44. The trench gate electrode 46 is adjacent to the part of the body region 38 that separates the emitter region 42 and the drift region 36, with the gate insulator 44 positioned in between the trench gate electrode 46 and the body region 38. The trench gate electrode 46 is made of a conducting material (such as polycrystalline silicon or metal). The gate insulator 44 is made of silicon oxide.

An emitter electrode 52 is formed on the silicon substrate 30. The emitter electrode 52 is made of aluminum. The emitter electrode 52 is electrically connected to the body region 38 and the emitter region 42. The emitter electrode 52 is electrically isolated from the trench gate electrode 46 by an insulator layer 48.

Figure 2:
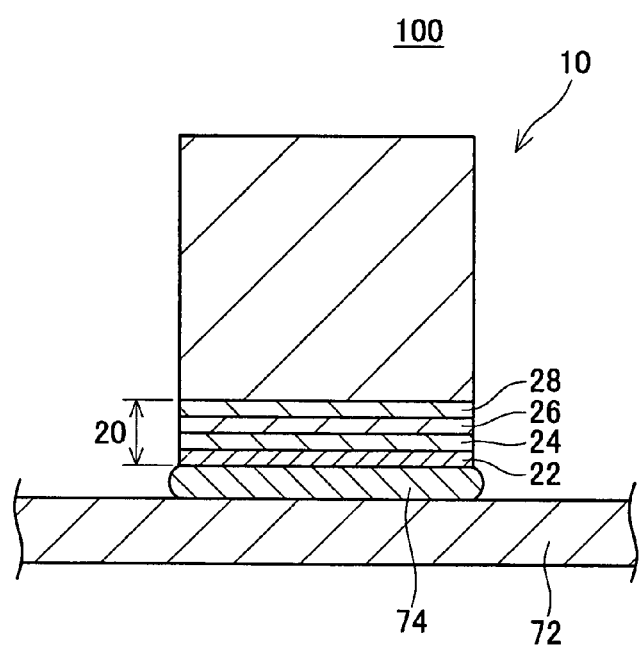
FIG. 2 shows a cross-sectional diagram of a module of a first embodiment.

FIG. 2 shows a cross-sectional diagram of a module 100 comprising the semiconductor device 10 and a ceramic substrate 72. The semiconductor device 10 is mounted on the ceramic substrate 72. The semiconductor device 10 is jointed to the ceramic substrate 72 with solder 74.

Figure 3:
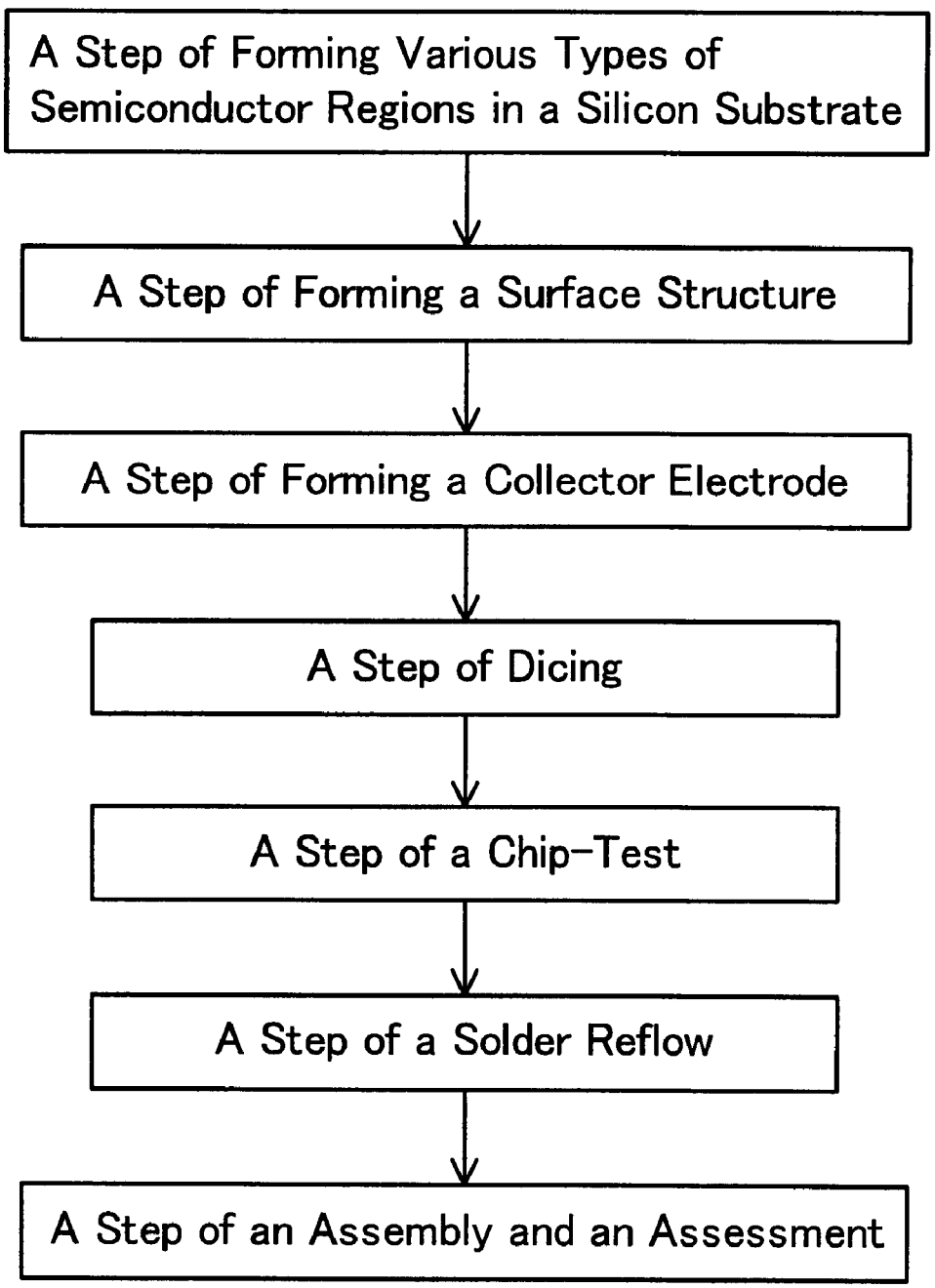
FIG. 3 shows a flow chart for mounting a semiconductor device of a first embodiment.

The module 100 is formed according to the flow chart in FIG. 3.

First, a step, during which various types of semiconductor regions are formed in the silicon substrate 30, is performed. When the next step is performed, a surface structure is formed on the top surface of the silicon substrate 30, wherein the surface structure includes the emitter electrode 52, the insulator layer 48 and a polyimide passivation mask. Next, a step, during which the collector electrode 20 is formed on the bottom surface of the silicon substrate 30, is performed. Then, the step, during which the silicon substrate 30 is diced, is performed. As a result, the silicon substrate 30 is divided into a plurality of the semiconductor devices 10. Next, a chip-test is performed to determinate if the semiconductor device 10 is suitable for use or not. Next, the semiconductor devices 10 that pass the chip-test are soldered to ceramic substrates 72 (during the solder reflow step). The temperature used to fuse the solder 74 is adjusted to between 200 and 450 degrees C. in order to control the exposure of heat to the semiconductor device 10. Under such conditions the heat exposure does not influence surface structures, such as the aluminum emitter electrode 52 and the polyimide passivation mask. Next, an assembly and assessment step is performed for the purpose of testing the semiconductor device 10 to ensure that it will perform according to manufacturing specifications.

As described above, during the solder reflow step, heat exposure occurs as the solder 74 is fused. At this point, the heat is applied to the collector electrode 20.

Figure 4:
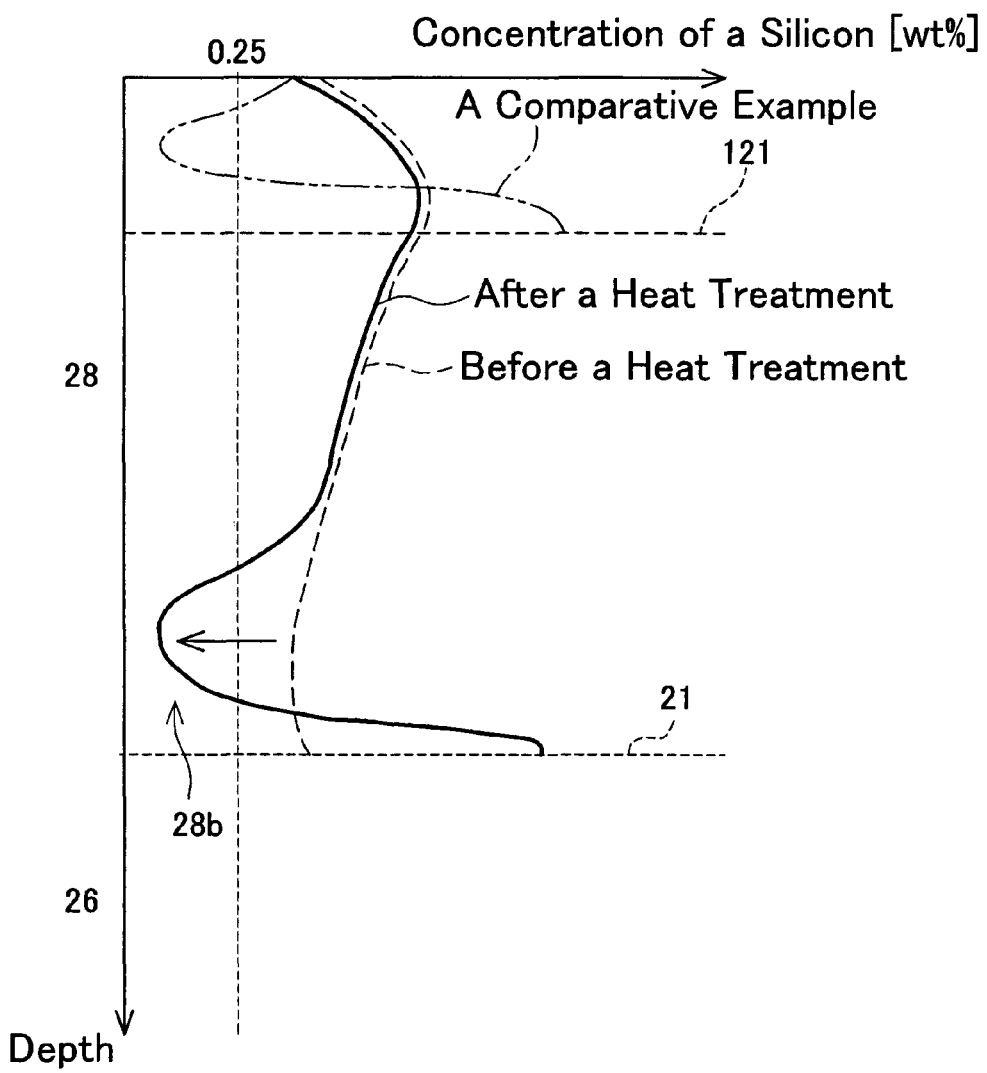
FIG. 4 shows a profile of the concentration of silicon in a first conductor layer across the depth of the first conductor layer.

FIG. 4 shows a profile of the silicon concentration across the depth of the first conductor layer 28 before and after the heat exposure. The broken line shows the profile of the silicon concentration before heat exposure, the solid line shows the profile of the silicon concentration after heat exposure.

As a comparative example, the double-dot broken line shows the profile of the silicon concentration in the thinner first conductor layer 28 after the heat exposure. In the comparative example, the broken line 121 shows the boundary between the first conductor layer 28 and the second conductor layer 26. The comparative example illustrates that silicon in the first conductor layer 28 diffuses towards the boundary 121 and, as a result, becomes concentrated at the boundary 121. Therefore, since the silicon in the first conductor layer 28 diffuses, the silicon concentration in the first conductor layer 28 also varies and, as a result, the silicon concentration across the depth of the first conductor layer 28 decreases as it approaches the silicon substrate 30. When the concentration of silicon in the first conductor layer 28, near the silicon substrate 30, decreases, a proportion of the silicon in the silicon substrate 30 will diffuse into the first conductor layer 28 in order to compensate for the localized decrease in silicon concentration. This diffusion causes the formation of the aluminum spike. The height of the aluminum spike can range between 0.2 and 0.8 μm. When the silicon concentration in the part of the first conductor layer 28 between the surface making contact with the silicon substrate 30 and a depth of 25 nm from the surface making contact with the silicon substrate 30 decreases, diffusion of silicon from the silicon substrate 30 into the first conductor layer 28 will occur. When the concentration of silicon in the above area decreases to below 0.25 [wt %], the diffusion of silicon from the silicon substrate 30 into the first conductor layer 28 is activated and aluminum spike formation is also activated.

In thin film IGBT, aluminum spike formation is a serious problem. In order to decrease switching loss, it is preferred that the thickness 32*a* of the collector region 32 is less than 1 μm. However, in such a thinner collector region 32, the aluminum spike may penetrate the collector region 32 and reach the buffer region 34. Therefore, the collector electrode 20 may be electrically connected to the buffer region 34. When the collector electrode 20 is electrically connected to the buffer region 34, the breakdown voltage of the semiconductor device is significantly decreased. Therefore, in thin film IGBT, measures to repress aluminum spike formation are especially useful.

In the semiconductor device 10 of the present embodiment, the thickness of the first conductor layer 28 is increased. In this case, when heat exposure occurs, a proportion of silicon in the first conductor layer 28, at the second conductor layer 26 side diffuses, towards the boundary 21 between the first conductor layer 28 and the second conductor layer 26. Therefore, the concentration of silicon in the first conductor layer 28 will decrease as it approaches the second conductor layer 26. The minimum concentration of silicon in the first conductor layer 28 in the region 28*b* may be less than 0.25 [wt %]. However, in the semiconductor device 10 of the present embodiment, the concentration of silicon in the first conductor layer 28 at the silicon substrate 30 side maintains substantially the same value before and after heat exposure. In the semiconductor device 10 of the present embodiment, the concentration of silicon in the first conductor layer 28, between the surface making contact with the silicon substrate 30 and a depth of 25 nm from the surface making contact with the silicon substrate 30, maintains substantially the same value before and after heat exposure. In another respect, the distance between the surface making contact with the silicon substrate 30 and the depth of the region 28*b*, the region at which silicon concentration is at a minimum in the first conductor layer 28, is greater than or equal to 50 nm. Therefore, the concentration of silicon in the above area does not substantially decrease and instead maintains a concentration comparable to the concentration prior to heat exposure, and the diffusion of silicon from the silicon substrate 30 into the first conductor layer 28 is repressed. In the semiconductor device 10 of the present embodiment, aluminum spike formation in the silicon substrate 30 can be repressed.

Figure 6:
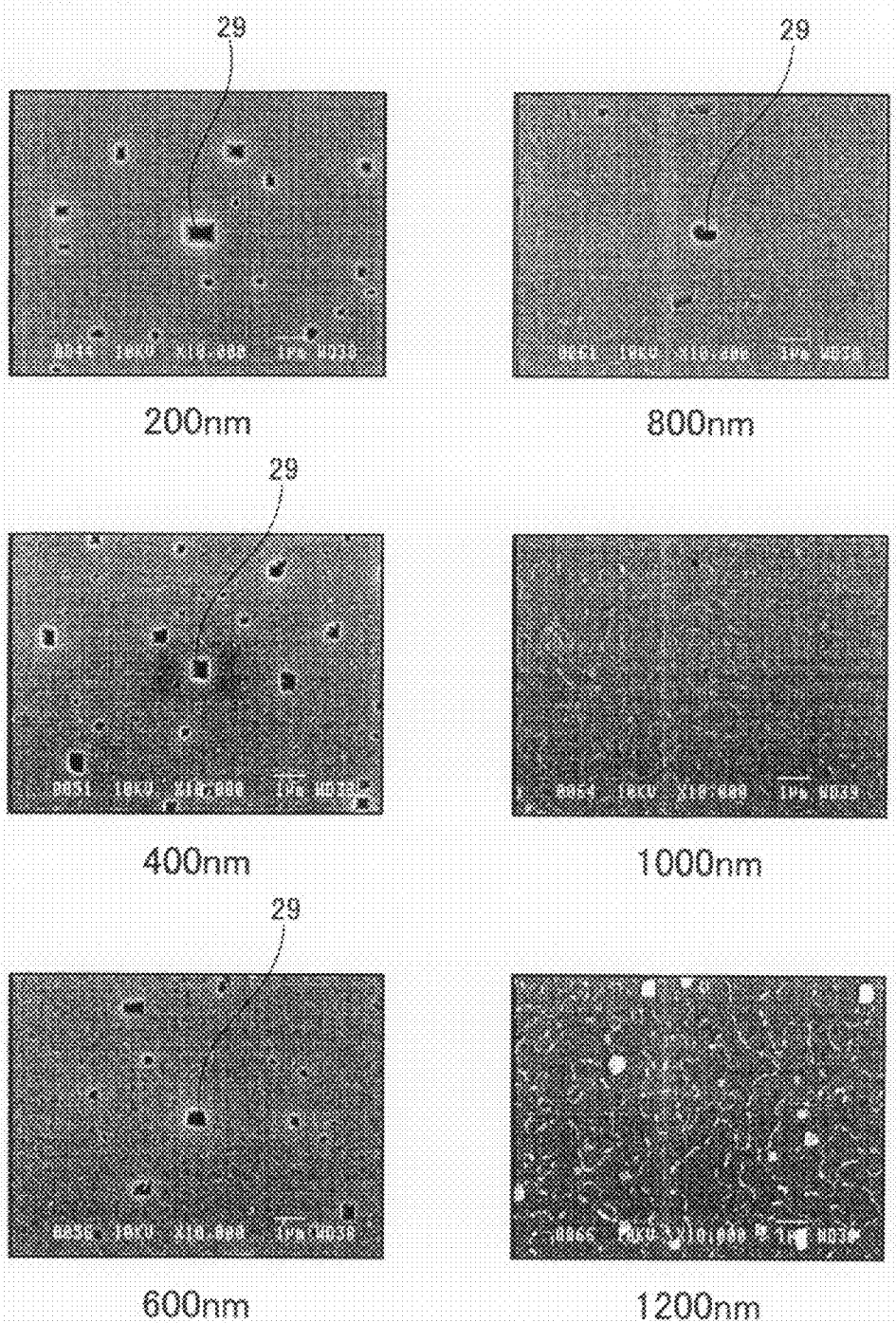
FIG. 6 shows the state of a bottom surface of a silicon substrate following heat exposure under the following conditions: two 10 minute exposures at 400 degrees C.

Next, the results of study of the aluminum spike formation will be explained in detail. The parameters for considered in the study of the heat exposure are the thickness of the first conductor layer 28 and the temperature of the heat exposure. FIG. 5, FIG. 6 and FIG. 7 show the bottom surface of silicon substrates 30 following heat exposure under a range of conditions. Furthermore, all pictures in FIG. 5, FIG. 6 and FIG. 7 were taken at the same magnification and have identical scale bars.

FIG. 5 shows the state of the bottom surface of a silicon substrate 30 following heat exposure at 375 degrees C. for two 10 minute exposures. When the first conductor layer 28 is 200 nm or 400 nm thick, aluminum spikes 29 form. However, the number of aluminum spikes in the sample with the 400 nm thick first conductor layer 28 is less than the number of aluminum spikes in the sample with the 200 nm thick first conductor layer 28. When the thickness of the first conductor layer 28 is greater than or equal to 600 nm, aluminum spikes do not form.

FIG. 6 shows the state of the bottom surface of a silicon substrate 30 following heat exposure at 400 degrees C. for two 10 minute exposures. When the first conductor layer is 200, 400, 600 or 800 nm thick, the aluminum spikes 29 form. However, when the thickness of the first conductor layer 28 is greater than or equal to 1000 nm, aluminum spikes do not form.

FIG. 7 shows the state of the bottom surface of a silicon substrate 30 following heat exposure at 425 degrees C. for two 10 minute exposures. Under these conditions, aluminum spikes 29 formed on all first conductor layer thickness. However, the greater the thickness of the first conductor layer 28, the fewer the number of the aluminum spike formed.

The above study illustrates that the greater the thickness of the first conductor layer 28, the fewer the number of aluminum spikes formed.

Second Embodiment

Figure 8:
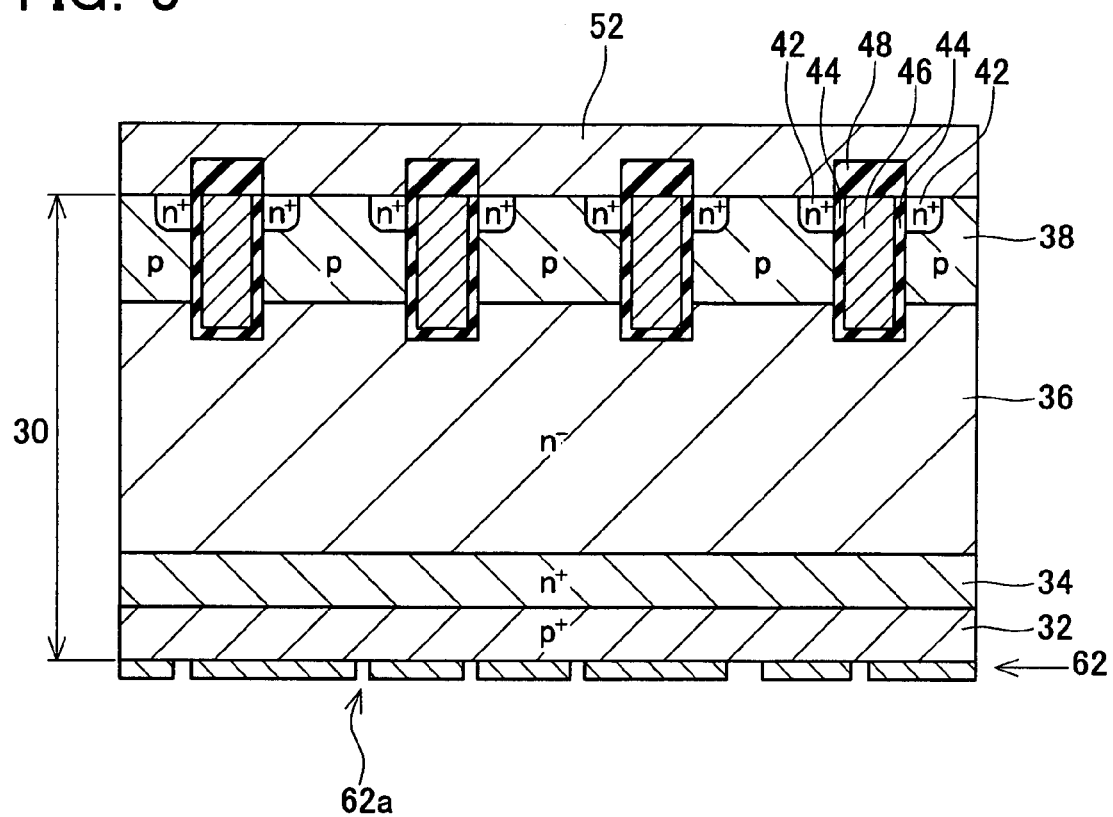
FIG. 8 shows the process of manufacturing a semiconductor device of a second embodiment at stage (1).
Figure 9:
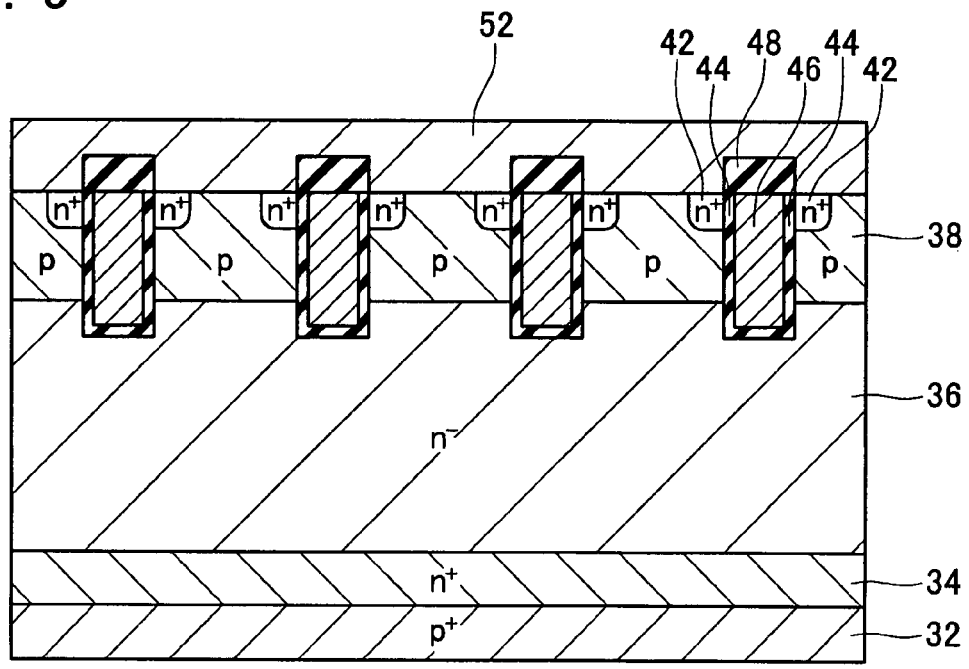
FIG. 9 shows the process of manufacturing a semiconductor device of a second embodiment at stage (2).

The semiconductor device of second embodiment comprises substantially the same structure as the semiconductor device 10 of first embodiment in FIG. 1. Therefore, FIG. 1 is referred to in the below description of the second embodiment. However, it is not required in second embodiment that the thickness of the first conductor layer 28 be as limited as first embodiment. However, if the thickness of the first conductor layer 28 is adjusted such that it becomes greater than 600 nm, the formation of aluminum spikes is significantly repressed by combining the techniques described in the first embodiment and the technique of second embodiment. The semiconductor device of second embodiment is characterized by its manufacturing method. With reference to FIG. 8 and FIG. 9, the manufacturing method of the semiconductor device of second embodiment is explained as follows.

First, as shown in FIG. 8, the silicon substrate 30 including a low concentration of n-type impurities is prepared. For example, a raw wafer is used for the silicon substrate 30. Next, the surface structure is formed in the silicon substrate 30.

In detail, the surface structure manufacturing method comprises steps below. First, the body region 38 is formed in the surface portion of the silicon substrate 30 by means of an ion-implantation technique. The silicon substrate 30 other than the body region 38 will become the drift region 36. Next, a plurality of emitter regions 42 is selectively formed in the surface portion of the body region 38 by means of an ion-implantation technique. Next, a plurality of trenches, in which each trench penetrates the body region 38 and reaches the drift region 36, is formed by means of a lithographic technique and an etching technique. Next, a silicon oxide layer is formed on the silicon substrate 30 and the inner walls of the plurality of trenches by means of the CVD (Chemical Vapor Deposition) method. Following the formation of the silicon oxide layer, a metal layer is formed on the silicon oxide layer by means of the CVD method. As a result, the plurality of trenches is filled with the metal layer. Next, the silicon oxide layer and the metal layer on the silicon substrate 30 are removed to leave the silicon oxide layer and the metal layer in the plurality of trenches. As a result, a gate insulator 44 and a trench gate 46 are formed in the each of the trenches. Next, the insulator layer 48 and the emitter electrode 52 are formed on the silicon substrate 30. By completing the steps mentioned above, the surface structure is attained.

Next, the thickness of the silicon substrate 30 is adjusted by polishing the bottom surface of the silicon substrate 30. When a breakdown voltage of 1200V is required for the semiconductor device, the thickness of the silicon substrate 30 is adjusted until approximately 150 µm.

Next, the buffer region 34 and the collector region 32 are formed in the reverse portion of the silicon substrate 30 by means of an ion-implantation technique. The dope depth of the boron and the phosphorus is controlled in accordance with the ion accelerating voltage. Next, the boron and the phosphorus doped into the silicon substrate 30 are activated by means of thermal annealing. The thickness of the buffer region 34 is adjusted until approximately 0.4 µm. The thickness of the collector region 32 is adjusted until approximately 0.3 µm.

By completing the steps mentioned above, the structure shown in FIG. 8 is attained.

Next, the structure shown in FIG. 8 is placed in a sputter device. When the structure shown in FIG. 8 is carried to the sputter device, the structure is exposed to air. Therefore, a native oxide 62 forms on the bottom surface of the silicon substrate 30. The thickness of the native oxide 62 is uneven. Therefore, several rough portions 62a are formed on the surface of the native oxide 62.

As shown FIG. 1, the collector electrode 20 is formed on the bottom surface of the silicon substrate 30 by means of a sputter technique. If the collector electrode 20 is formed on the bottom surface of silicon substrate 30 without removing the native oxide 62, the native oxide 62 will exist between the silicon substrate 30 and the collector electrode 20. If solder reflow is performed without removing native oxide 62, the rough portions 62a can easily cause the formation of an aluminum spike in the silicon substrate 30 on the bottom surface.

In the present embodiment, as shown FIG. 9, the native oxide 62 is removed before the collector electrode 20 is formed. The native oxide 62 is removed by means of an inverse sputter technique using the sputter device. Therefore, the bottom surface of the silicon substrate 30 is formed into flat surface. Furthermore, the silicon substrate 30 etching step and the first conductor layer 28 forming step are sequentially performed under vacuum using a sputter device. Therefore, the bottom surface of the silicon substrate 30 is not exposed to air. As a result, the boundary between the silicon substrate 30 and the first conductor layer 28 is free from native oxide 62. In a semiconductor device manufactured using the above manufacturing method, the number of the starting points for aluminum spike formation are decreased and, as a result, the formation of aluminum spikes can be repressed.

In the following, the method for manufacturing the collector electrode 20 will be explained in detail.

First, a target material, which has 1:1 atom ratio between silicon and aluminum, is selected. And, the first conductor layer 28 is formed on the bottom surface of the silicon substrate 30 while maintaining the temperature of silicon substrate 30 at a temperature below 400 degrees C. The first conductor layer 28 is formed such that the thickness of the first conductor layer 28 is greater than or equal to 600 nm.

Next, titanium is selected as the target material. And, the second conductor layer 26 is formed on the first conductor layer 28 while maintaining the temperature of silicon substrate 30 at a temperature below 400 degrees C. The second conductor layer 26 is formed such that the thickness of the second conductor layer 26 is approximately 200 nm.

Next, nickel is selected as the target material. And, the third conductor layer 24 is formed on the second conductor layer 26 while maintaining the temperature of silicon substrate 30 at ambient temperature. The third conductor layer 24 is formed such that the thickness of the third conductor layer 24 is approximately 100 nm.

By completing the steps mentioned above, the semiconductor device of second embodiment is attained. In the semiconductor device manufactured using the above manufacturing method, the number of the starting points for the formation of aluminum spikes is decreased and, as a result, the formation of aluminum spikes in the silicon substrate 30 can be repressed.

Specific examples of the present invention have been described above, but these examples are not intended to limit the scope of the claims of the present invention. Within the scope of the claims, various modifications are possible with the embodiments of the present invention described above.

For example, the technique for removing native oxide by using the inverse sputter technique is also useful for the production of a collector electrode which is not configured with stack electrode.

Furthermore, the technological components described in the present specification and diagrams are not to be limited by the above-mentioned combinations, as the technological components exhibit technical utility either individually or in various combinations. In addition, the art described in the present specification and diagrams attains multiple objectives simultaneously, and the present invention can be said to have technical utility if it reaches at least one of those objectives.

What is claimed is:

1. A semiconductor device comprising:
a silicon chip having a plurality of semiconductor regions distributed within the silicon chip; and
a bottom electrode formed on a bottom surface of the silicon chip to make electric contact,
wherein the bottom electrode comprises:
a first conductor layer formed on the bottom surface of the silicon chip and including aluminum and silicon;
a second conductor layer formed on the first conductor layer and including titanium; and
a third conductor layer formed on the second conductor layer and including nickel,
wherein the third layer is to be soldered to a substrate that is different from the silicon chip, and
wherein a thickness of the first conductor layer is greater than or equal to 600 nm.

2. The semiconductor device according to claim 1, wherein a boundary between the silicon chip and the first conductor layer is free from native oxide.

3. The semiconductor device according to claim 1, wherein the silicon chip comprises a collector region formed within the surface of the silicon chip and includes a p-type impurity.

4. A module comprising:
the semiconductor device according to claim 1; and
a ceramic substrate,
wherein the semiconductor device is soldered to the ceramic substrate.

5. A method of manufacturing the module according claim 4, the method comprising:
soldering the semiconductor device to the ceramic substrate at the bottom surface side by maintaining the soldering temperature at less than or equal to 400 degrees C.

6. The semiconductor device according to claim 1, further comprising:
a top electrode formed on a top surface of the silicon chip to make electric contact with at least one semiconductor region that is different from a semiconductor region making electric contact with the bottom electrode.

7. A semiconductor device comprising:
a silicon chip having a plurality of semiconductor regions distributed within the silicon chip; and
a bottom electrode formed on a bottom surface of the silicon chip to make electric contact,
wherein the bottom electrode comprises:
a first conductor layer formed on the bottom surface of the silicon chip and including aluminum and silicon;
a second conductor layer formed on the first conductor layer and including titanium; and
a third conductor layer formed on the second conductor layer and including nickel, wherein:
the third layer is to be soldered to a substrate that is different from the silicon chip;
the concentration of silicon in the first conductor layer varies across a depth of the first conductor layer such that the concentration decreases at a depth between a surface making contact with the silicon chip and a surface making contact with the second conductor layer; and
a distance between the surface making contact with the silicon chip and the depth at which the concentration of silicon is at a minimum in the first conductor layer is greater than or equal to 50 nm.

8. The semiconductor device according to claim 7, wherein a thickness of the first conductor layer is greater than or equal to 600 nm.

9. A semiconductor device comprising:
a silicon chip having a plurality of semiconductor regions distributed within the silicon chip; and
a bottom electrode formed on a bottom surface of the silicon chip to make electric contact,
wherein the bottom electrode comprises:
a first conductor layer formed on the bottom surface of the silicon chip and including aluminum and silicon;
a second conductor layer formed on the first conductor layer and including titanium; and
a third conductor layer formed on the second conductor layer and including nickel,
wherein the third layer is to be soldered to a substrate that is different from the silicon chip, and
wherein the concentration of silicon in the first conductor layer, between a surface making contact with the silicon chip and a depth of 25 nm from the surface making contact with the silicon chip, maintains substantially the same value before and after heat exposure during soldering of the semiconductor device to the substrate.

10. The semiconductor device according to claim 9, wherein a thickness of the first conductor layer is greater than or equal to 600 nm.

11. The semiconductor device according to claim 9, wherein:
the concentration of silicon in the first conductor layer varies across a depth of the first conductor layer so that the concentration of silicon decreases at a depth between the surface making contact with the silicon chip and a surface making contact with the second conductor layer; and
a distance between the surface making contact with the silicon chip and the depth at which the concentration of silicon is at a minimum in the first conductor layer is greater than or equal to 50 nm.

* * * * *